(12) United States Patent
Kim

(10) Patent No.: US 6,487,712 B1
(45) Date of Patent: Nov. 26, 2002

(54) METHOD OF MANUFACTURING MASK FOR CONDUCTIVE WIRINGS IN SEMICONDUCTOR DEVICE

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 150 days.

(21) Appl. No.: 09/695,153

(22) Filed: Oct. 24, 2000

(30) Foreign Application Priority Data

Oct. 25, 1999 (KR) ............................................. 99-46436

(51) Int. Cl.[7] .................. G06F 17/50; G06F 19/00; G03F 1/08; G21K 5/00
(52) U.S. Cl. .................. 716/21; 430/5; 378/35; 700/103; 700/105; 700/120; 700/121
(58) Field of Search .................. 716/1–21; 430/4–5; 378/34–35; 382/144–145; 700/96, 103–105, 108–111, 120–121

(56) References Cited

U.S. PATENT DOCUMENTS

| | | | |
|---|---|---|---|
| 5,385,867 A | | 1/1995 | Ueda et al. .................. 431/195 |
| 5,436,097 A | * | 7/1995 | Norishima et al. ............. 430/5 |
| 5,459,093 A | * | 10/1995 | Kuroda et al. ............... 438/599 |
| 5,477,466 A | * | 12/1995 | Tripathi et al. ............... 716/21 |
| 5,483,481 A | * | 1/1996 | Hizume et al. ............... 365/63 |
| 5,506,162 A | | 4/1996 | Hirose et al. ................. 437/51 |
| 5,557,534 A | * | 9/1996 | Wu ............................ 716/19 |
| 5,597,668 A | * | 1/1997 | Nowak et al. ................. 430/5 |
| 5,636,131 A | * | 6/1997 | Liebmann et al. ............. 716/19 |
| 5,733,713 A | | 3/1998 | Yano et al. .................. 430/316 |
| 5,790,417 A | * | 8/1998 | Chao et al. ................... 716/21 |
| 5,798,298 A | * | 8/1998 | Yang et al. .................. 438/622 |
| 5,895,942 A | | 4/1999 | Deguchi ...................... 257/209 |
| 5,911,857 A | | 6/1999 | Kim ...................... 204/192.15 |
| 5,948,573 A | * | 9/1999 | Takahashi ...................... 430/5 |
| 5,970,238 A | * | 10/1999 | Shibata et al. .................. 716/8 |
| 6,001,685 A | | 12/1999 | Kim ............................ 438/253 |
| 6,044,007 A | * | 3/2000 | Capodieci .................... 365/120 |
| 6,099,992 A | * | 8/2000 | Motoyama et al. ............. 430/5 |
| 6,194,105 B1 | * | 2/2001 | Shacham et al. ............... 430/5 |
| 6,194,252 B1 | * | 2/2001 | Yamaguchi ................. 438/129 |
| 6,197,452 B1 | * | 3/2001 | Matumoto ..................... 430/5 |
| 6,225,013 B1 | * | 5/2001 | Cohen et al. .................. 430/30 |
| 6,253,362 B1 | * | 6/2001 | Anand et al. ................... 716/8 |
| 6,379,868 B1 | * | 4/2002 | White ......................... 430/311 |

FOREIGN PATENT DOCUMENTS

JP   0242146 A   *   9/1998   ....... H01L/21/3205

* cited by examiner

Primary Examiner—Matthew Smith
Assistant Examiner—Phallaka Kik
(74) Attorney, Agent, or Firm—Timothy J. Keefer; Wildman, Harrold, Allen & Dixon

(57) ABSTRACT

Disclosed is a method of manufacturing a mask for conductive wirings in a semiconductor device, wherein the conductive wirings are formed on a semiconductor substrate of the semiconductor device, comprising the steps of: (a) calculating data for the entire regions of the semiconductor substrate on which the conductive wirings are formed; (b) reading the size, shape and position of the conductive wiring patterns for the conductive wirings to generate data for conductive wirings, and storing the generated conductive wirings data; (c) extending the conductive wirings data by a predetermined size to generate data for the extended conductive wirings; (d) subtracting the extended conductive wirings data from the data for the entire regions of the semiconductor substrate to calculate a differential data between the extended conductive wirings data and the entire regions data, and to generate data for dummy conductive wiring pattern; (e) adding the conductive wirings data to the dummy conductive wiring pattern data to form a pattern the size and position of which correspond to data obtained by the addition operation on the mask by using a clear field method.

5 Claims, 7 Drawing Sheets

METHOD OF MANUFACTURING MASK FOR CONDUCTIVE WIRINGS IN SEMICONDUCTOR DEVICE

CROSS REFERENCE TO RELATED APPLICATION

This application claims the priority of Korean patent application Serial No. 99-46436 filed on Oct. 25, 1999.

BACKGROUND OF THE INVENTION

1. Field of the Invention

The present invention relates to a method of manufacturing a mask for conductive wirings in a semiconductor device, and more particularly, a method of manufacturing a mask for conductive wirings in a semiconductor device which is adapted to more easily perform a planarization process for an interlayer insulating film formed on the upper portion of conductive wirings for interconnecting respective elements disposed on a semiconductor substrate.

2. Description of the Related Art

Currently, as the development of semiconductor devices follows a trend toward an increased capacity and a highly integrated degree, an area of the semiconductor devices becomes reduced increasingly, and consequently, a metal wiring within the semiconductor devices and the width thereof are reduced. There is therefore a need for a conductive wiring structured of several layers together with this structure.

In order to construct such a conductive wiring into several layers, and, at the same time, to minimize the size of the conductive wirings, it is necessary that an interlayer insulating film formed on the upper portion of a lower conductive wiring should be planarized. The aim of this planarization for the interlayer insulating film is to improve the depth of a focus in the process of development of a light sensitive film for patterning an upper conductive wiring. Also, such a planarization process is a requisite for depositing a film made of tungsten and performing successively a CMP (Chemical-Mechanical Polishing) process when forming a tungsten plug to bury a contact.

In the meantime, a process of manufacturing a mask for a conventional semiconductor device will be described hereinafter with respect to the present invention.

First, a layout for a circuit to be formed is designed, and the layout for the circuit is to calculate the size of a physical device generating an electrical parameter according to the formation of the circuit. In the process of this layout, the size in length of a designed drawing for a circuit determines the thickness of a layer to be deposited by CVD or to be doped, and the vertical size thereof determines the size of a wafer pattern, which become a basis for a reduced drawing of a resultant circuit called a composite drawing.

After the completion of the layout, a digitizing process is performed for determining a coordinate of a drawing in which a semiconductor circuit is designed to fabricate a mask. That is, the drawing is positioned on an X-Y board in which a cursor is connected to a computer, and the cursor reads the size, shape and position of each pattern in the drawing to store them in a memory of the computer. This information on the pattern is used for fabrication of a reticle or in an Ebeam driving system.

When such a digitizing process is completed, the pattern is copied to form a mask, which is called the reticle. This reticle is an emulsion plate or a chrome thin film selectively exposed to a light from a pattern generator (PG). The pattern generator (PG) consists of a light source and a high-speed shutter which is controlled by a computer, and the pattern is developed to form opaque and transparent areas on a surface of the reticle like a photo film development. The pattern of the reticle is transferred to a mask on which a photoresist having a uniform thin film is coated by the light source.

By using the mask fabricated through the above-mentioned processes, conductive wirings of a semiconductor device are formed. If another upper conductive wiring is formed to form a multi-layered conductive wiring, an interlayer insulating film is formed on a conductive wiring formed previously, followed by a planarization process being performed on the interlayer insulating film.

Meanwhile, in performing such a planarization process, an interval between respective conductive wirings formed in the same layer determines whether or not the planarization process will be performed successively, which will be described hereinafter with reference to FIG. 1.

Figure 1:
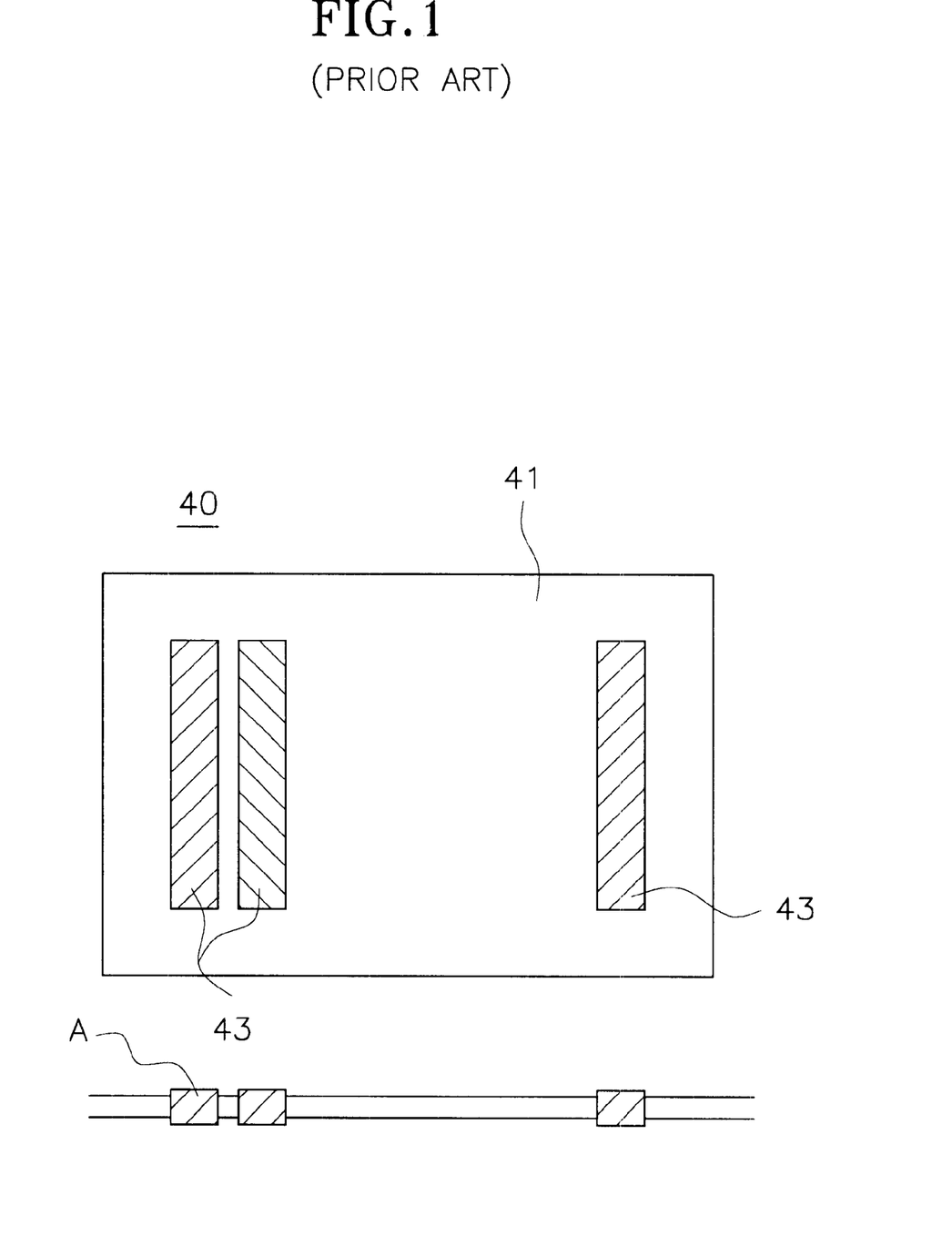
FIG. 1 is a top view illustrating a pattern mask used for a planarization process in a typical semiconductor device according to the prior art.

FIG. 1 is a top view illustrating a mask 40 used for forming conductive wirings in a typical semiconductor device according to the prior art.

In FIG. 1, each conductive wiring pattern (chrome pattern) is formed on a conventional typical a mask 40 for conductive wirings according to the type of a conductive wiring to be formed on a glass substrate 40. Conductive wirings are formed on a semiconductor substrate through a patterning process using this mask 40.

Figure 2A:
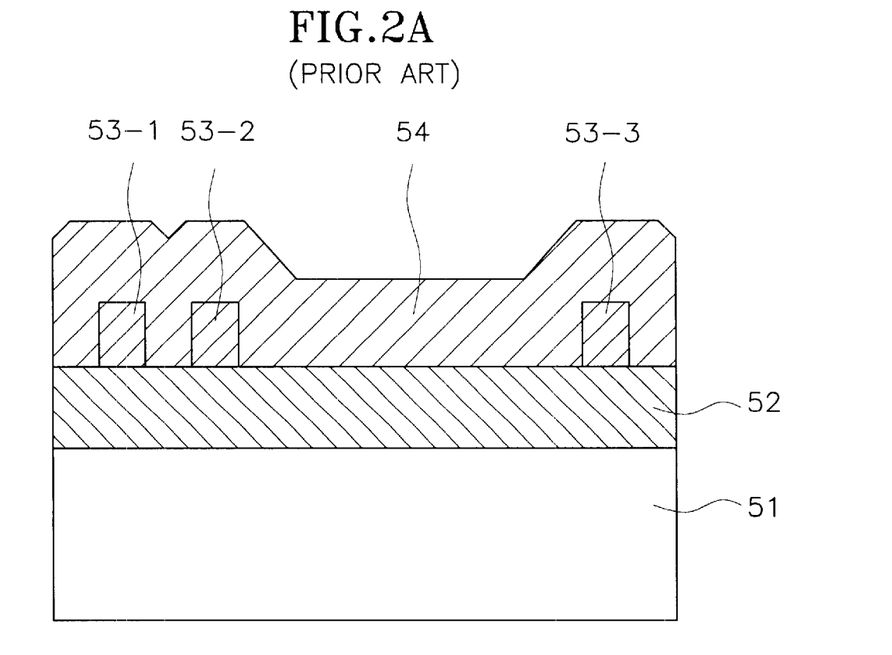
FIGS. 2A and 2B are cross-sectional views illustrating a structure in the state in which a planarization process is performed by using the pattern mask in a typical semiconductor device according to the prior art.

FIG. 2A is a cross-sectional views illustrating a semiconductor device in which conductive wirings are formed using the mask 40 shown in FIG. 1, followed by forming an another interlayer insulating layer to form upper conductive wirings according to the prior art.

Referring to FIG. 2A, after a first interlayer insulating layer 52 has been formed on a top surface of the a semiconductor substrate 51, respective conductive wirings 53-1, 53-2, and 53-3 are formed on the first interlayer insulating layer 52 by using the mask 40 shown in FIG. 1. Then, a second interlayer insulating layer 54 is formed on the first interlayer insulating layer 52 and the respective conductive wirings 53-1, 53-2, and 53-3 to build a structure having the shape as shown in FIG. 2A.

In the state in which this process is completed, in order to form another upper conductive wiring on the second interlayer insulating layer 54, it is necessary that the planarization process should be performed on the second interlayer insulating layer 54.

Figure 2B:
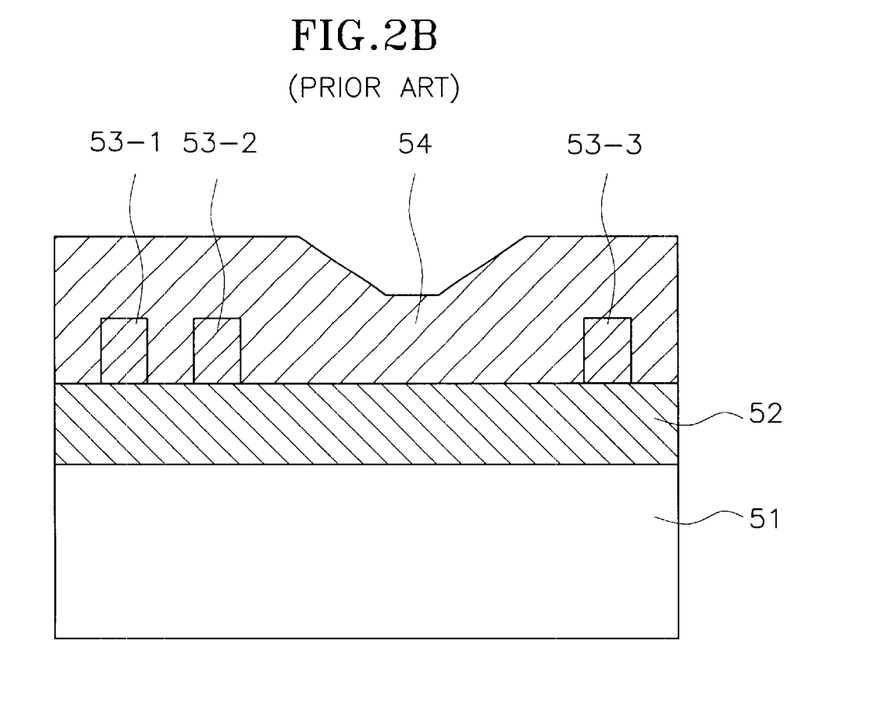

FIG. 2B is a cross-sectional view illustrating a semiconductor device in the state in which a CMP process for the planarization is performed on the structure as shown in FIG. 2A, and the top surface of the second interlayer insulating film 54 is washed.

As shown in FIG. 2A, dishings occur on the top surfaces of the second interlayer insulating film 54 corresponding to the region between the conductive wirings 53-1 and 53-2 spaced apart at a minimum interval and the region between the conductive wirings 53-2 and 53-3 among the conductive wirings 53-1, 53-2 and 53-3, so that the planarization for the second interlayer insulating film 54 is not accomplished normally.

Furthermore, though the dishing formed corresponding to the region between the conductive wirings 53-1 and 53-2 is eliminated by the planarization process, in the case of the dishing formed corresponding to the region between the conductive wirings 53-2 and 53-3 shown in FIG. 2B, the top surface of a region of the interlayer insulating film 54 where a difference in a space between the conductive wirings is greater has a deeper step portion when compared with the top planar surface of the remaining regions of the interlayer insulating film 54. As a result, there has been a problem in that since a pad of CMP equipment is out of contact with the top surface of the region of the interlayer insulating film 54 having the deeper step formed therein, it is very difficult to achieve a complete planarization for the interlayer insulating film 54 according to the density of the conductive wirings and shape of arranged conductive wirings in a semiconductor chip (semiconductor device).

Figure 3A:
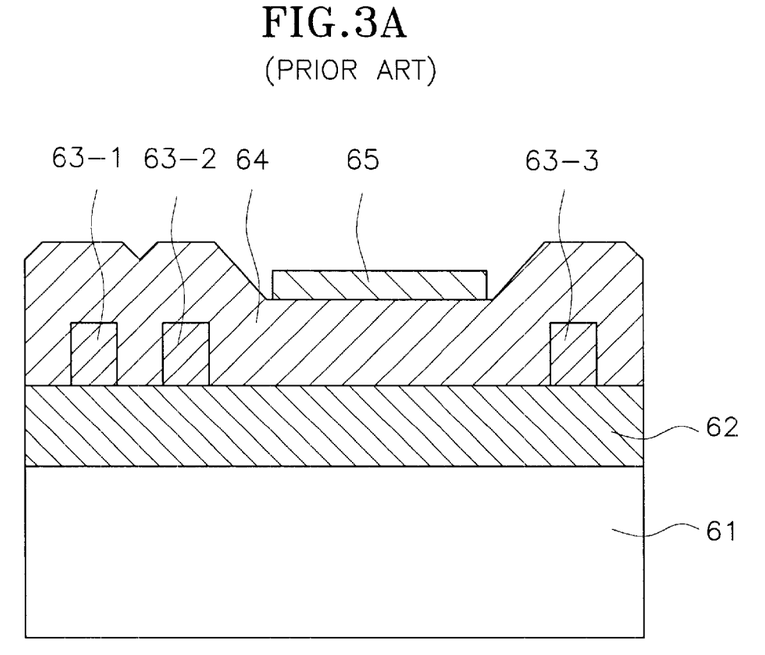
FIGS. 3A and 3B are cross-sectional views illustrating a structure in the state in which another planarization process is performed by using the pattern mask in a typical semiconductor device according to the prior art.
Figure 3B:
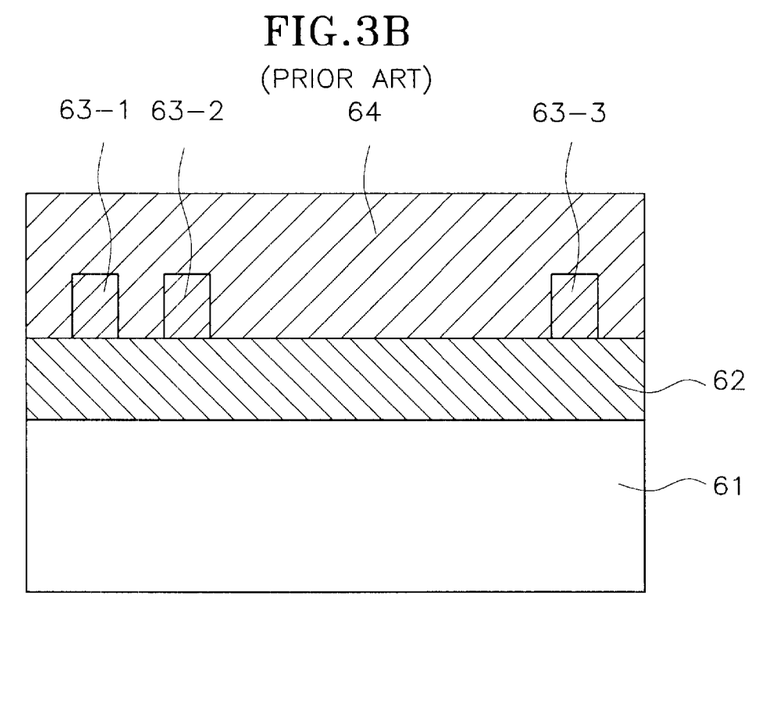

In the meantime, FIGS. 3A and 3B are cross-sectional views illustrating a semiconductor device for which another planaraization process has been performed using a separate step compensating layer in order to resolve the above conventional problem.

First, in FIG. 3A, after a first interlayer insulating film 62 has been formed on a semiconductor substrate 61, respective conductive wirings 63-1, 63-2, and 63-3 are formed thereon by using the mask 40 as shown in FIG. 1. A second interlayer insulating film 64 is then formed on the conductive wirings 63-1, 63-2, and 63-3 and the first interlayer insulating film 62 to form upper conductive wirings thereon.

After a formation of the second interlayer insulating film 64 has been completed, in order to compensate a step portion formed on the surface thereof a separate step compensating film 65 is formed in the step portion as shown in FIG. 3A prior to execution of the planarization process for the second interlayer insulating film 64.

Namely, the size of the step portion varies with the distance spaced between the respective conductive wirings 63-1, 63-2 and 63-3 in the second interlayer insulating film 64. For this reason, in order to prevent an abnormal planarization in the second interlayer insulating film 64, the step compensating film 65 is additionally formed on the step portion in a portion of the second interlayer insulating film 64 formed between the conductive wirings 63-2 and 63-3 spaced apart at a relatively large interval from each other among the conductive wirings 63-1, 63-2 and 63-3 by a separate process.

At this time, the step compensating film 65 formed on the top surface of the second interlayer insulating film 64 having the step portion is usually formed of the same material as that forming the second interlayer insulating film 64 for efficiency of the planarization process On the other hand, when a structure having a configuration as shown in FIG. 3a through the above process is fabricated, the planarization process is conducted to form upper conductive wirings on the second interlayer insulating film 64.

FIG. 3B is a cross-sectional view illustrating a semiconductor device structure in the state in which a planaraization process for the structure shown in FIG. 3A has been completed.

That is, unlike in the case of FIGS. 2A and 2B, the planaraization process is conducted after compensating the step portion formed in the second interlayer insulating film 64 by using the step compensating film 65, thereby preventing a dishing. Owing to this, as shown FIG. 3B, a normal planarization process is completed.

As another conventional method, unlike in the case of FIGS. 3A and 3B, there is a method in which a dummy pattern is formed at the same time upon first fabrication of a mask, and a conductive wiring and a dummy wiring of a semiconductor device using this mask are formed through a single process.

However, in the case of using a conventional method of forming respective conductive wirings as described above, a defect in the planarization process as shown in FIGS. 2A and 2B can be compensated, but an additional process for forming a separate step compensating film 65 as shown in FIG. 3A, i.e., a mask process and a patterning process for forming the step compensating film 65 are added, thereby reducing productivity of the semiconductor device.

Namely, as described above, in order to form a dummy wiring additionally besides the conductive wiring, it is necessary that a dummy pattern for the dummy wiring should be further drawn on a drawing for fabrication of a reticle. In addition, the dummy pattern must also be formed additionally on a mask for forming the conductive wiring, thereby resulting in generation of a manufacturing cost of the mask and a loss of labor.

SUMMARY OF THE INVENTION

Therefore, the present invention has been made in view of the above-mentioned problems, and it is an object of the present invention to provide a method of manufacturing a mask for conductive wirings in a semiconductor device in which a pattern for a dummy wiring is formed to fabricate the mask by using data values for the conductive wirings without actually forming the dummy wiring pattern on a mask in forming the dummy wiring pattern between conductive wiring patterns spaced apart at a larger interval from each other during the fabrication of the mask of the semiconductor device.

According to an aspect of the present invention, there is provided a method of manufacturing a mask for conductive wirings in a semiconductor device, wherein the conductive wirings are formed on a semiconductor substrate of the semiconductor device, comprising the steps of:

(a) calculating data for the entire regions of the semiconductor substrate on which the conductive wirings are formed;

(b) reading the size, shape and position of the conductive wiring patterns for the conductive wirings to generate data for the conductive wirings, and storing the generated conductive wirings data;

(c) extending the conductive wirings data by a predetermined size to generate data for the extended conductive wirings;

(d) subtracting the extended conductive wirings data from the data for the entire regions of the semiconductor substrate to calculate a differential data between the extended conductive wirings data and the entire regions data, and to generate data for dummy conductive wiring pattern;

(e) adding the conductive wirings data to the dummy conductive wiring pattern data to form a pattern the size and position of which correspond to data obtained by the addition operation on the mask by using a clear field method.

According to another aspect of the present invention, there is also provided a method of manufacturing a mask for conductive wirings in a semiconductor device, wherein the conductive wirings are formed on a semiconductor substrate of the semiconductor device, comprising the steps of:

(a) reading the size, shape and position of the conductive wiring patterns for the conductive wirings to be formed on the silicon substrate to generate data for conductive wirings, and storing the generated conductive wirings data;

(b) extending the conductive wirings data by a predetermined size to generate data on the extended conductive wirings; and (c) subtracting the conductive wirings data from the extended conductive wirings data to calculate a differential data between the conductive wirings data and the extended conductive wirings data, and forming a pattern the size and position of which correspond to the difference data on the mask by using a dark field method.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Description will now be made in detail to the preferred embodiments of the present invention.

First, the present invention is designed in such a fashion that a dummy wiring pattern is formed between conductive wiring patterns spaced apart at a larger interval from each other while forming conductive wiring patterns without performing a separate additional process in the process of fabrication of the mask of the semiconductor device, and the conductive wirings are formed by using this mask, thereby easily performing a planarization process for the semiconductor device.

Figure 4A:
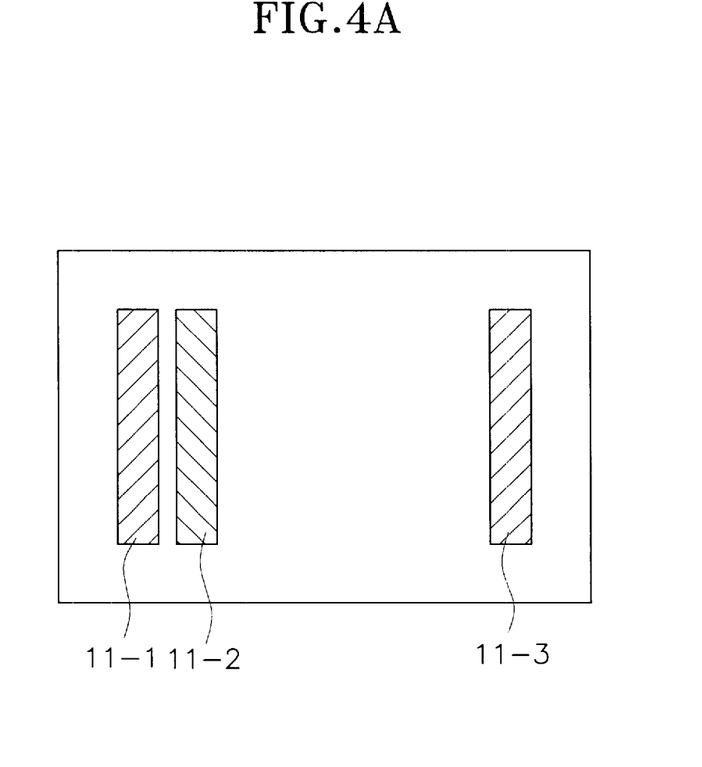
FIGS. 4A and 4B are top views illustrating conductive wiring patterns used in a method of manufacturing a mask for conductive wirings in a semiconductor device according to the present invention.
Figure 4B:
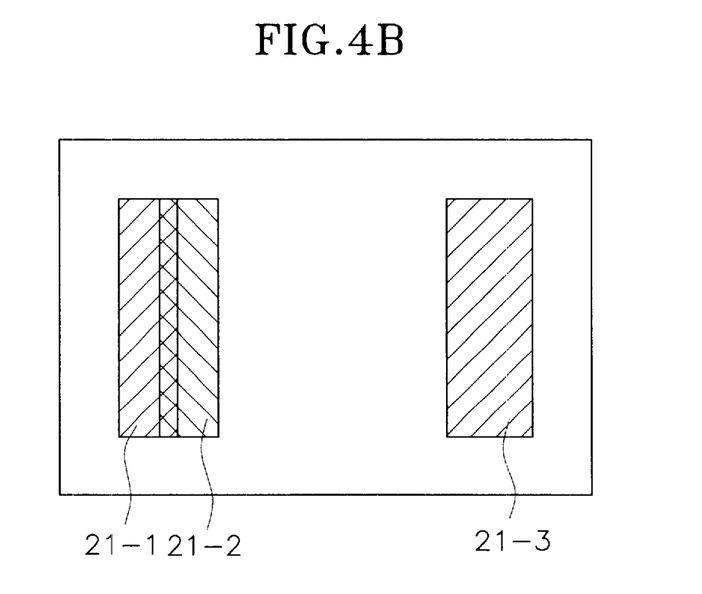

FIGS. 4A and 4B are top views illustrating conductive wiring patterns used in a method of manufacturing a mask for conductive wirings in a semiconductor device according to the present invention.

In the case of forming conductive wiring patterns of a type as shown in FIG. 4A, it is required that a mask of a type as shown in FIG. 4A should be fabricated. At this time, in order to fabricate the mask, firstly a layout of a semiconductor circuit to be formed should be designed, and then a digitizing should be conducted according to the layout to grasp the size, shape and position of respective conductive wiring patterns 11-1, 11-2, and 11-3.

At this time, it is assumed that data on the grasped size and position of the respective conductive wiring patterns 11-1, 11-2, and 11-3 is A, and data on the entire regions of the semiconductor device (silicon substrate) is C.

In the meantime, when the data A on the size and position of the respective conductive wiring patterns 11-1, 11-2, and 11-3 to be formed on the mask is calculated through the above-mentioned process, the data A on the size and position of the respective conductive wiring patterns 11-1, 11-2 and 11-3 is firstly extended by a predetermined size, followed by forming respective conductive wiring patterns 21-1, 21-2 and 21-3 having the size and shape as shown in FIG. 4B to form a dummy pattern according to the present invention.

That is, FIG. 4B is a top view illustrating extended conductive wiring patterns 21-1, 21-2 and 21-3 formed by extending the respective conductive wiring patterns 11-1, 11-2 and 11-3 as shown in FIG. 4A by a predetermined size. Here, it is assumed that data on the size and position of the respective extended conductive wiring patterns 21-1, 21-2, and 21-3 is B.

Through this process, when the data A on the size and position of the respective conductive wiring patterns 11-1, 11-2 and 11-3 to be formed on the mask, the data B on the size and position of the respective extended conductive wiring patterns 21-1, 21-2, and 21-3, and the data C on the size and position of the entire regions of the semiconductor device (silicon substrate) are calculated, a pattern generation (PG) process for fabrication of the mask is conducted based on the respective calculated data values A, B, and C. Namely, a reticle is manufactured.

More specifically, as described above, in order to form the respective conductive wirings and a dummy wiring together on the semiconductor substrate through the mask manufacturing process according to the present invention, first of all, an operation of (C-B)+A is performed by an internal program of a computer for conducting the pattern generation process.

That is, when the data B on the respective extended conductive wiring patterns 21-1, 21-2, and 21-3 is subtracted from the data C on the entire regions of the semiconductor device (silicon substrate), data D of a dummy conductive wiring pattern is calculated. Then, the data A on the size and position of the respective conductive wiring patterns 11-1, 11-2 and 11-3 is added to the calculated data D on the dummy conductive wiring pattern.

Figure 5A:
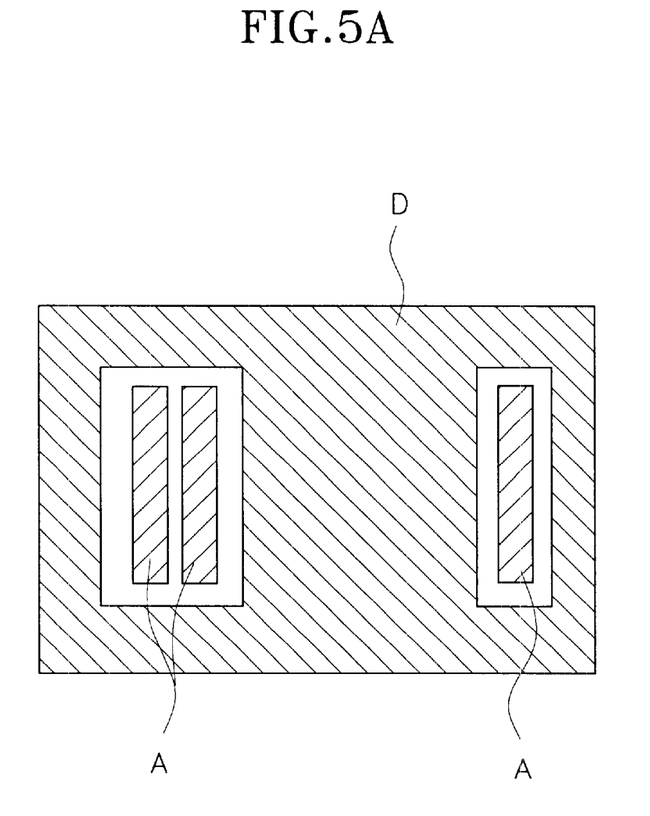
FIGS. 5A and 5B are top views illustrating the state in which a method of manufacturing a mask for conductive wirings in a semiconductor device is performed according to the present invention.

Therefore, data obtained as the result of the operation of (C-B)+A becomes data having regions indicated by hatched lines as shown in FIG. 5A, i.e., data combined with the data A representative of the size and position of the respective conductive wiring patterns 11-1, 11-2 and 11-3, and the data D for the dummy conductive wiring pattern.

Here, the dummy conductive wiring pattern data D, as shown in FIG. 5A, may be composed of data for the remaining regions left by excepting data for the extended conductive wirings pattern data B from the data C for the entire regions of the silicon substrate. Alternatively, the dummy conductive wiring pattern data D, as shown in FIG. 5B, may be composed of a combination of a plurality of partial data each having so enough size as not to affect conduction of the planarization in the process of the planarization.

Figure 5B:
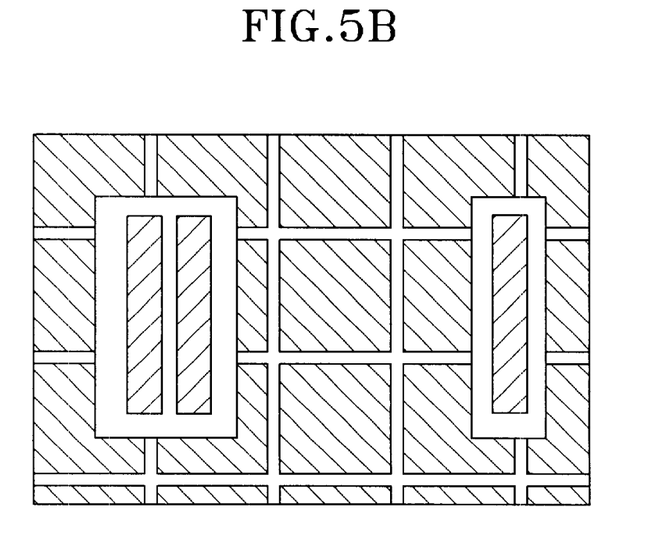

Meanwhile, when the reticle is fabricated based on the data A+D corresponding to the hatched region as shown in FIGS. 5A and 5B, and a conductive wiring mask is fabricated by using the reticle, the same mask as that shown in FIGS. 5A and 5B, i.e., a mask on which the respective conductive wiring patterns and the dummy conductive wiring pattern are formed together is manufactured. At this time, the mask manufacturing process uses a method in which the respective conductive wiring patterns and the dummy conductive wiring pattern are formed on the mask by using a polarity of the mask as a clear field, i.e., a method in which a film formed of chrome for shielding light is formed on a region where data exists in the mask manufacturing process.

Alternatively, in the case where the respective conductive wiring patterns and the dummy conductive wiring pattern are formed on the mask by using a polarity of the mask as a dark field, i.e., the film formed of chrome for shielding light is formed on a region where data does not exist in the mask manufacturing process, the mask can be manufactured by calculating data for the remaining regions left by excepting the respective conductive wiring pattern data A from the extended conductive wiring pattern data B.

In the meantime, the above-mentioned respective mask manufacturing methods are suitable for the case where a light sensitive film used in a semiconductor device manufacturing method is positive. On the other hand, if the light sensitive film is negative, the polarity of the mask is opposite to that of the above-mentioned method in which the light sensitive film is positive.

After the manufacture of the mask is completed through such a process, conductive wirings are formed on the silicon substrate by using the manufactured mask.

Figure 6A:
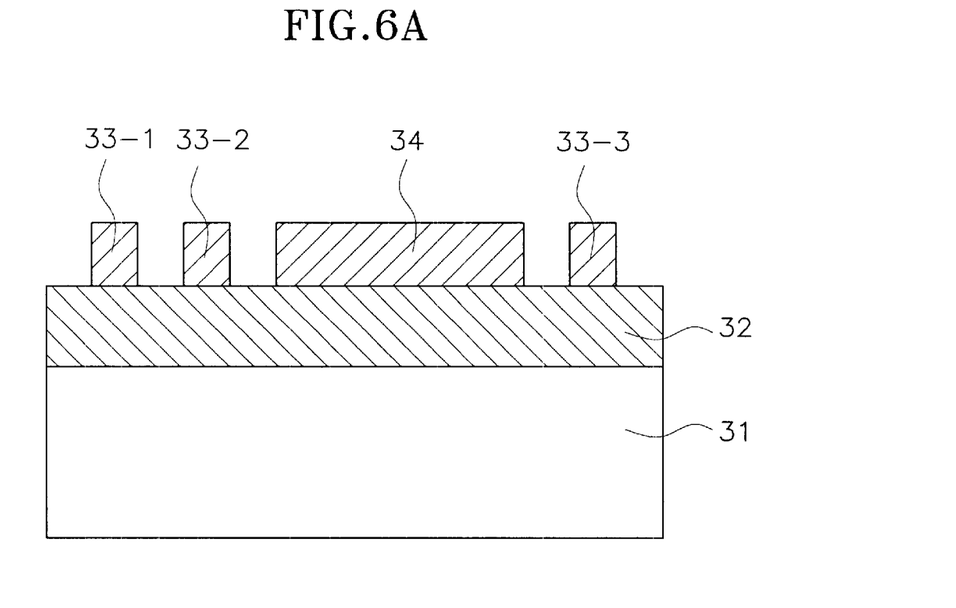
FIGS. 6A, 6B, and 6C are cross-sectional views illustrating a circuit structure in the state in which a planarization process is performed by using a mask by a method of manufacturing a mask for conductive wirings in a semiconductor device according to the present invention.

FIG. 6A is a cross-sectional view illustrating a semiconductor structure in the state in which conductive wirings and a dummy wiring are formed by using a mask of a type as shown in FIG. 5A.

The semiconductor structure comprises a semiconductor substrate 31, a first interlayer insulating film 32 formed thereon, a first, second and third conductive wirings 33-1, 33-2 and 33-3 each formed on the first interlayer insulating film 32, and a dummy wiring 34 formed thereon.

Subsequently, after formation process (patterning process of the respective conductive wirings 33-1, 33-2 and 33-3, and the dummy wiring 34 is completed as shown in FIG. 6A, another interlayer insulating film is formed on the respective conductive wirings 33-1, 33-2 and 33-3, and the dummy wiring 34 to form upper conductive wirings.

Figure 6B:
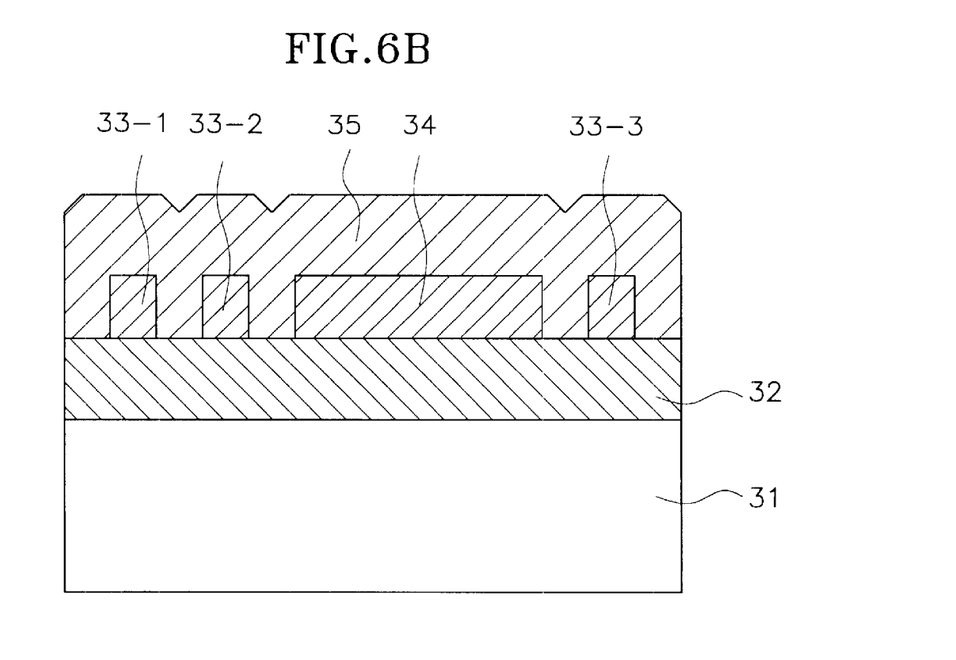

FIG. 6B is a cross-sectional view illustrating a semiconductor structure in the state in which a second interlayer insulating film 35 is formed on the conductive wirings 33-1, 33-2 and 33-3 and the dummy wiring 34 as shown in FIG. 6A.

As shown in FIG. 6B, a step portion is not formed on the surface of the second interlayer insulating film 35 formed on the conductive wirings 33-1, 33-2 and 33-3 and the dummy wiring 34 when compared with the second interlayer insulating film 54 of FIG. 2A according to the conventional method.

Figure 6C:
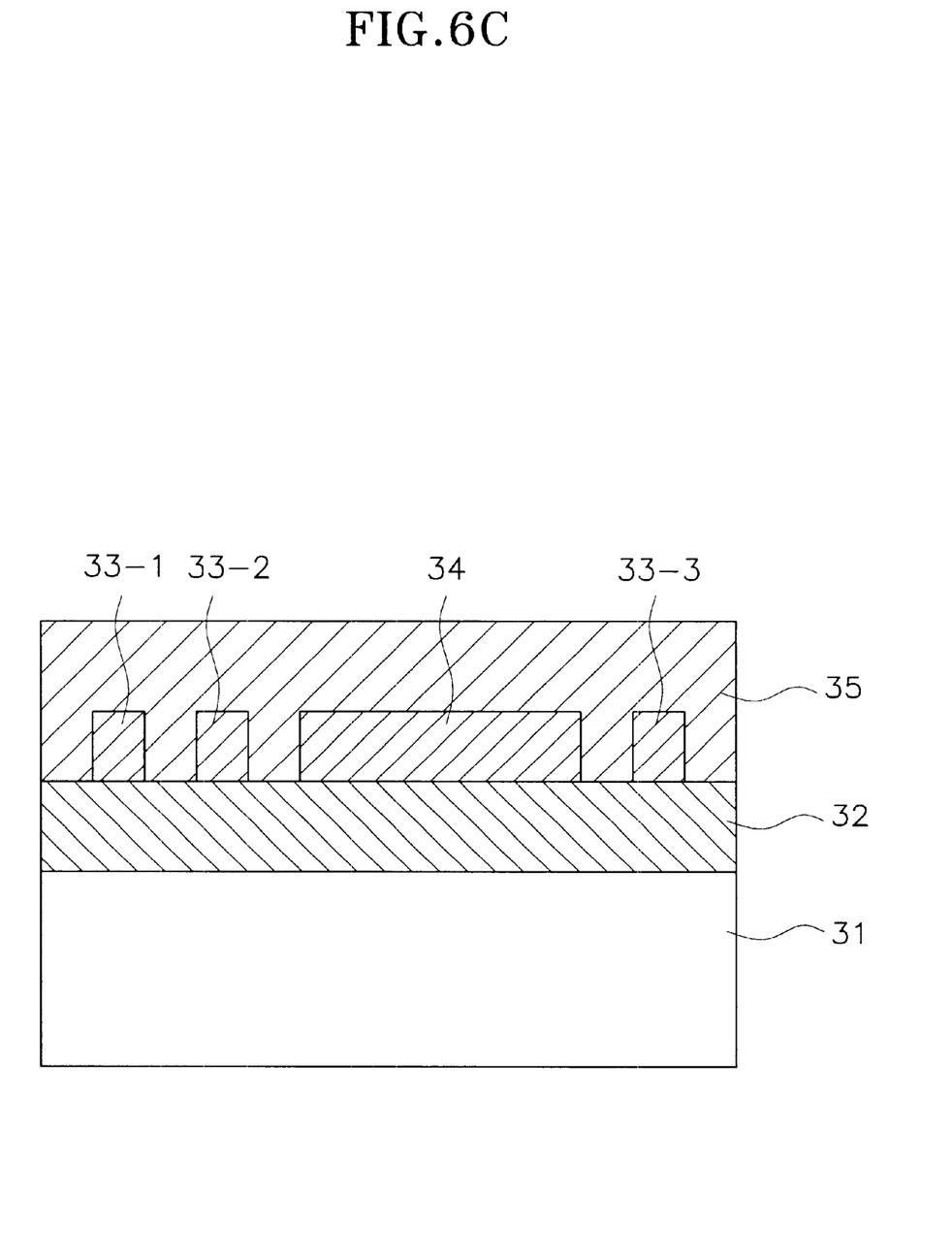

Therefore, when a planarization process is conducted on the top surface of the second interlayer insulating film of the semiconductor structure of a type as shown in FIG. 6B, a semiconductor structure on which a normal planarizaiton process is completed can be fabricated as shown FIG. 6C.

For this reason, upon formation of upper electrodes, the correct depth of a focus is adjusted so that accurate conductive wiring patterns are formed.

As can be seen from the foregoing, the mask manufacturing method of the present invention has advantages in that a pattern for a dummy wiring is formed by using data values for the conductive wirings without actually forming the dummy wiring pattern on a mask in forming the dummy wiring pattern between conductive wiring patterns spaced apart at a larger interval from each other during the fabrication of the mask of the semiconductor device, thereby simplifying the process for forming the dummy wiring pattern, and resulting in reduction of a manufacturing cost of the mask for the dummy wiring pattern and a loss of labor.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A method of manufacturing a mask for conductive wirings in a semiconductor device, wherein the conductive wirings are formed on a semiconductor substrate of the semiconductor device, comprising the steps of:

(a) calculating data for entire regions of the semiconductor substrate on which the conductive wirings are formed;

(b) reading size, shape and position of conductive wiring patterns for the conductive wirings to generate data for conductive wirings, and storing the generated conductive wirings data;

(c) extending the conductive wirings data by a predetermined size to generate data for extended conductive wirings;

(d) subtracting extended conductive wirings data from the data for the entire regions of the semiconductor substrate to calculate a differential data between the extended conductive wirings data and the entire regions data, and to generate data for dummy conductive wiring pattern;

(e) adding the conductive wirings data to the dummy conductive wiring pattern data to form a pattern having a size and a position of which correspond to data obtained by an addition operation on the mask by using a clear field method.

2. The method according to claim 1, wherein the step (d) further comprises a step of subtracting the extended conductive wirings data from the data for the entire regions of the semiconductor substrate to calculate a differential data between the extended conductive wirings data and the entire regions data, and to generate data for a plurality of dummy conductive wiring patterns divided into predetermined sized regions, each of the predetermined sized regions being spaced apart at a predetermined interval from each other based on the calculated differential data.

3. The method according to claim 2, wherein the step (e) further comprises a step of adding the conductive wirings data to the plurality of dummy conductive wiring patterns data to form a pattern a size and a position of which correspond to data obtained by the addition operation on the mask by using the clear field method.

4. A method of manufacturing a mask for conductive wirings in a semiconductor device, wherein the conductive wirings are formed on a semiconductor substrate of the semiconductor device, comprising the steps of:

(a) reading size, shape and position of conductive wiring patterns for the conductive wirings to be formed on the semiconductor substrate to generate data for conductive wirings, and storing the generated conductive wirings data;

(b) extending the conductive wirings data by a predetermined size to generate data for extended conductive wirings; and (c) subtracting the conductive wirings data from the extended conductive wirings data to calculate a differential data between the conductive wirings data and the extended conductive wirings data, and forming a pattern having a size and a position of which correspond to a difference data on the mask by using a dark field method.

5. The method according to claim 4, wherein the step (c) further comprises the steps of:

subtracting the conductive wirings data from the extended conductive wirings data to calculate a differential data between the conductive wirings data and the extended wirings data;

dividing the differential data into a plurality of difference data, each having a predetermined size; and forming a pattern on the mask so that the plurality of difference data, each being positioned at regions spaced apart at a predetermined interval from each other by using a dark field method.

* * * * *